United States Patent
Porob et al.

(10) Patent No.: US 10,193,030 B2
(45) Date of Patent: Jan. 29, 2019

(54) COMPOSITE MATERIALS HAVING RED EMITTING PHOSPHORS

(71) Applicant: General Electric Company, Schenectady, NY (US)

(72) Inventors: Digamber Gurudas Porob, Bangalore (IN); James Edward Murphy, Niskayuna, NY (US); Florencio Garcia, Schenectady, NY (US); Megan Marie Brewster, Washington, DC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 7 days.

(21) Appl. No.: 15/231,026

(22) Filed: Aug. 8, 2016

(65) Prior Publication Data
US 2018/0040782 A1    Feb. 8, 2018

(51) Int. Cl.
*H01L 33/00* (2010.01)
*H01L 33/50* (2010.01)
(Continued)

(52) U.S. Cl.
CPC .......... *H01L 33/502* (2013.01); *C08K 3/013* (2018.01); *C08K 3/08* (2013.01); *C08K 3/34* (2013.01);
(Continued)

(58) Field of Classification Search
CPC ..... H01L 33/502; H01L 33/56; H01L 33/644; C08K 3/0033; C08K 3/08; C08K 3/34; C09K 11/02; C09K 11/617
See application file for complete search history.

(56) References Cited

U.S. PATENT DOCUMENTS

| | | |
|---|---|---|
| 6,558,574 B2 | 5/2003 | Gwak et al. |
| 7,358,542 B2 | 4/2008 | Radkov et al. |

(Continued)

FOREIGN PATENT DOCUMENTS

WO    2007/024359 A1    3/2007

OTHER PUBLICATIONS

Shen et al., "Polyethylene nanofibres with very high thermal conductivities", Nature Nanotechnology, Mar. 2010, vol. 5, pp. 251-255.
(Continued)

*Primary Examiner* — Victor A Mandala
*Assistant Examiner* — Colleen E Snow
(74) *Attorney, Agent, or Firm* — GE Global Patent Operation; Nitin Joshi

(57) ABSTRACT

A lighting apparatus includes an LED light source radiationally coupled to a composite material including a phosphor of formula I and a thermally conductive material dispersed in at least a portion of a binder material. The thermally conductive material includes a material selected from the group consisting of indium oxide, tin oxide, indium tin oxide, calcium oxide, barium oxide, strontium oxide, aluminum hydroxide, magnesium hydroxide, calcium hydroxide, barium hydroxide, strontium hydroxide, zinc hydroxide, aluminum phosphate, magnesium phosphate, calcium phosphate, barium phosphate, strontium phosphate, diamond, graphene, polyethylene nanofibers, carbon nanotubes, silver metal nanoparticles, copper metal nanoparticles, gold metal nanoparticles, aluminum metal nanoparticles, boron nitride, silicon nitride, an alkali metal halide, calcium fluoride, magnesium fluoride, a compound of formula II, and combinations thereof.

10 Claims, 1 Drawing Sheet

Figure 1:
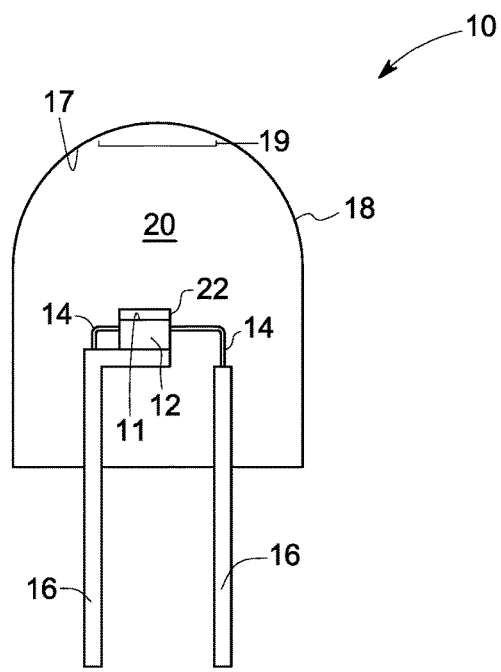

(51) Int. Cl.

| | | |
|---|---|---|
| *C08K 3/013* | (2018.01) | |
| *C08K 3/08* | (2006.01) | |
| *C08K 3/34* | (2006.01) | |
| *C09K 11/02* | (2006.01) | |
| *C09K 11/61* | (2006.01) | |
| *H01L 33/56* | (2010.01) | |
| *H01L 33/64* | (2010.01) | |

(52) U.S. Cl.
CPC ............ *C09K 11/02* (2013.01); *C09K 11/025* (2013.01); *C09K 11/616* (2013.01); *C09K 11/617* (2013.01); *H01L 33/501* (2013.01); *H01L 33/56* (2013.01); *H01L 33/644* (2013.01); *C08K 2201/001* (2013.01); *C08K 2201/005* (2013.01)

(56) References Cited

U.S. PATENT DOCUMENTS

| | | | |
|---|---|---|---|
| 7,497,973 | B2 | 3/2009 | Radkov et al. |
| 7,648,649 | B2 | 1/2010 | Radkov et al. |
| 7,658,999 | B2 | 2/2010 | Clovesko et al. |
| 7,897,248 | B2 | 3/2011 | Barrera et al. |
| 7,923,922 | B2 | 4/2011 | Geohegan et al. |
| 8,057,706 | B1 | 11/2011 | Setlur et al. |
| 8,252,613 | B1 | 8/2012 | Lyons et al. |
| 8,496,852 | B2 | 7/2013 | De Graff et al. |
| 8,519,603 | B2 | 8/2013 | Yang et al. |
| 8,593,062 | B2 | 11/2013 | Murphy et al. |
| 8,835,199 | B2 | 9/2014 | Kolodin et al. |
| 8,906,724 | B2 | 12/2014 | Murphy et al. |
| 9,028,718 | B2 | 5/2015 | Kijima et al. |
| 2006/0226758 | A1* | 10/2006 | Sofue .................. C09D 183/04 313/483 |
| 2010/0096974 | A1 | 4/2010 | Setlur et al. |
| 2011/0169394 | A1 | 7/2011 | Chowdhury et al. |
| 2014/0021501 | A1 | 1/2014 | Chen et al. |
| 2014/0131757 | A1 | 5/2014 | Lin et al. |
| 2015/0028365 | A1 | 1/2015 | Kurtin et al. |
| 2015/0048399 | A1* | 2/2015 | Weiler .................. H01L 33/502 257/98 |
| 2016/0043285 | A1 | 2/2016 | Basin et al. |

OTHER PUBLICATIONS

Shahil et al., "Thermal Properties of Graphene: Applications in Thermal Interface Materials", ECS transactions, 2011, vol. 35, Issue: 3, pp. 193-199.

Alexander A. Balandin, "Thermal properties of graphene and nanostructured carbon materials", Nature Materials, 2011, vol. 10, pp. 569-581.

Kim et al., "Effective Heat Dissipation from Color-Converting Plates in High-Power White Light Emitting Diodes by Transparent Graphene Wrapping", ACS Nano, 2016, vol. 10, Issue: 1, pp. 238-245.

Song et al., "New design of hybrid remote phosphor with single-layer graphene for application in high-power LEDs", Chemical Engineering Journal, Mar. 1, 2016, vol. 287, pp. 511-515.

International Search Report and Written Opinion issued in connection with corresponding PCT Application No. PCT/US2017/051705 dated Jan. 4, 2018.

\* cited by examiner

COMPOSITE MATERIALS HAVING RED EMITTING PHOSPHORS

STATEMENT REGARDING FEDERALLY SPONSORED RESEARCH AND DEVELOPMENT

This invention was made with Government support under contract number DE-EE0003251 awarded by the U.S. Department of Energy. The Government has certain rights in the invention.

BACKGROUND

Red-emitting phosphors based on complex fluoride materials activated by $Mn^{4+}$, such as those described in U.S. Pat. Nos. 7,358,542, 7,497,973, and 7,648,649, can be utilized in combination with yellow/green emitting phosphors such as YAG:Ce or other garnet compositions to achieve warm white light (CCTs<5000 K on the blackbody locus, color rendering index (CRI>80) from a blue LED, equivalent to that produced by current fluorescent, incandescent and halogen lamps. These materials absorb blue light strongly and efficiently emit between about 610-635 nanometers (nm) with little deep red/NIR emission. Therefore, luminous efficacy is maximized compared to red phosphors that have significant emission in the deeper red where eye sensitivity is poor. Quantum efficiency can exceed to 85% under blue (440-460 nm) excitation.

While the efficacy and CRI of lighting systems using $Mn^{4+}$ activated (or doped) fluoride hosts can be quite high, one potential limitation is their susceptibility to degradation under fabrication and use conditions, for example under high temperature and humidity. It is possible to reduce this degradation using post-synthesis processing steps, as described in U.S. Pat. No. 8,252,613. However, development of other methods for improving stability of the materials is desirable.

BRIEF DESCRIPTION

Briefly, in one aspect, a lighting apparatus includes a light emitting diode (LED) light source radiationally coupled to a composite material including a phosphor of formula I and a thermally conductive material dispersed in at least a portion of a binder material, $$A_x[(M, Mn)F_y] \quad (I)$$

wherein the thermally conductive material comprises a material selected from the group consisting of indium oxide, tin oxide, indium tin oxide, calcium oxide, barium oxide, strontium oxide, aluminum hydroxide, magnesium hydroxide, calcium hydroxide, barium hydroxide, strontium hydroxide, zinc hydroxide, aluminum phosphate, magnesium phosphate, calcium phosphate, barium phosphate, strontium phosphate, diamond, graphene, polyethylene nanofibers, carbon nanotubes, silver metal nanoparticles, copper metal nanoparticles, gold metal nanoparticles, aluminum metal nanoparticles, boron nitride, silicon nitride, an alkali metal halide, calcium fluoride, magnesium fluoride, a compound of formula II, and combinations thereof;

$$A_x[MF_y] \quad (II)$$

wherein A is independently at each occurrence Li, Na, K, Rb, Cs, or combinations thereof, M is independently at each occurrence Si, Ge, Sn, Ti, Zr, Al, Ga, In, Sc, Hf, Y, La, Nb, Ta, Bi, Gd, or combinations thereof, x is independently at each occurrence an absolute value of a charge on a $[(M, Mn)F_y]$ ion and a $[MF_y]$ ion, and y is 5, 6, or 7.

In one aspect, a lighting apparatus includes an LED light source radiationally coupled to composite material. The composite material includes a phosphor layer comprising a phosphor of formula I dispersed in at least a portion of a first binder material and a thermally conductive layer comprising a thermally conductive material dispersed in a second binder material disposed on the phosphor layer. The thermally conductive material includes a material selected from the group consisting of indium oxide, tin oxide, indium tin oxide, calcium oxide, barium oxide, strontium oxide, aluminum hydroxide, magnesium hydroxide, calcium hydroxide, barium hydroxide, strontium hydroxide, zinc hydroxide, aluminum phosphate, magnesium phosphate, calcium phosphate, barium phosphate, strontium phosphate, diamond, graphene, polyethylene nanofibers, carbon nanotubes, silver metal nanoparticles, copper metal nanoparticles, gold metal nanoparticles, aluminum metal nanoparticles, boron nitride, silicon nitride, an alkali metal halide, calcium fluoride, magnesium fluoride, a compound of formula II, and combinations thereof

DRAWINGS

Figure 2:
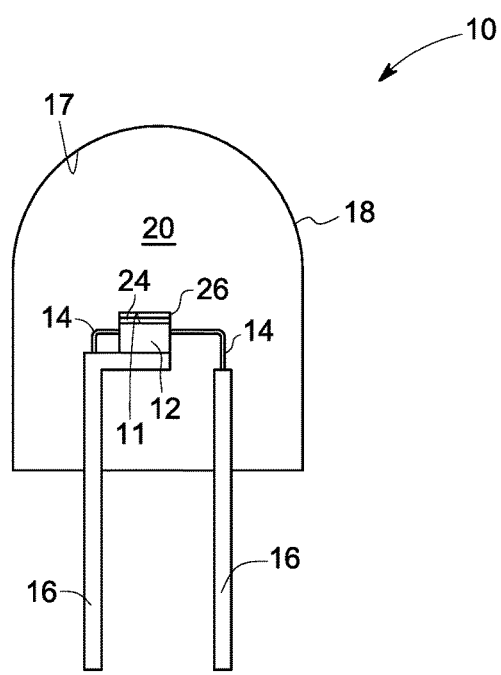

These and other features, aspects, and advantages of the present invention will become better understood when the following detailed description is read with reference to the accompanying drawing in which like characters represent like parts throughout the drawings, wherein:

FIG. 1 is a schematic cross-sectional view of a lighting apparatus, in accordance with one embodiment of the present disclosure; and FIG. 2 is a schematic cross-sectional view of a lighting apparatus, in accordance with another embodiment of the present disclosure.

DETAILED DESCRIPTION

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not limited to the precise value specified. In some instances, the approximating language may correspond to the precision of an instrument for measuring the value.

As used herein, the terms "phosphor", "phosphor composition", and "phosphor material" may be used to denote both a single phosphor as well as blends of two or more phosphors. As used herein, the terms "lamp", "lighting apparatus", and "lighting system" refer to any source of visible and ultraviolet light, which can be generated by at least one light emitting element producing a light emission when energized, for example, a phosphor material or a light emitting diode.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. As used herein, the term "disposed on" refers to layers or materials disposed directly in contact with each other or indirectly by having intervening layers or features there between, unless otherwise specifically indicated.

With reference to FIG. 1, a non-limiting example of a configuration of a lighting apparatus, for example a lamp 10, is shown in accordance with one embodiment. The lamp 10 includes a light emitting diode (LED) light source, for example an LED chip 12, and leads 14 electrically attached to the LED chip 12. The leads 14 may include thin wires supported by a thicker lead frame(s) 16 or the leads 14 may include self-supported electrodes and the lead frame 16 may be omitted. The leads 14 provide current to the LED chip 12 and thus cause the LED chip 12 to emit radiation.

The light source may be any blue or UV light source that is capable of producing white light when its emitted radiation is directed onto a phosphor. The LED chip 10 may be a near-UV or blue emitting LED. The LED chip 10 may comprise a semiconductor diode based on any suitable III-V, II-VI or IV-IV semiconductor layers and having an emission wavelength of about 250 to 550 nanometers (nm). In particular, the LED chip 10 may contain at least one semiconductor layer comprising GaN, ZnSe or SiC. For example, the LED chip 10 may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 550 nm. In one embodiment, the LED chip 10 is a blue light emitting LED chip having a peak emission wavelength from about 400 to about 500 nm.

Although the general discussion of the exemplary structures of the disclosure discussed herein is directed toward LED based light sources and more specifically to inorganic LED based light sources, it should be noted that the LED chip may be replaced by an organic LED based light source or any other light source unless otherwise noted and that any reference to the LED chip is merely representative of an appropriate light source.

The LED chip 12 may be encapsulated within a casing 18, which encloses the LED chip 12 and an encapsulant material 20. The casing 18 may be, for example, glass or plastic. The LED chip 12 may be substantially centered in the encapsulant material 20. The encapsulant material 20 may be an epoxy, plastic, low temperature glass, polymer, or any other suitable encapsulating material as is known in the art. In certain embodiments, the encapsulant material 20 is an epoxy or a polymer material, such as silicone. Both the casing 18 and the encapsulant material 20 should be transparent or substantially transmissive with respect to the wavelength of light emitted from the LED chip 12, the phosphor of formula I (described below), any additional luminescent material (described below), or combinations thereof to be transmitted through those elements.

Alternately, the lamp 10 may only comprise the encapsulant material 20 without a casing 18. The LED chip 12 may be supported, for example, using one or more of the lead frame 16, the self-supporting electrodes, the bottom of the casing 18, or a pedestal (not shown) mounted on the lead frame 16. In some embodiments, the LED chip 12 is mounted in a reflective cup (not shown). The reflective cup may be made from or coated with a reflective material, such as alumina, titania, or other dielectric material known in the art.

In the lamp 10, the LED chip 12 is radiationally coupled to a composite material. The composite material includes a phosphor of formula I and a thermally conductive material dispersed in at least a portion of a binder material. Radiationally coupled means that the elements are associated with each other so that radiation emitted from one is transmitted to the other. As illustrated in FIG. 1, a layer 22 of the composite material is disposed on at least a portion of a surface 11 of the LED chip 12. The layer 22 may be disposed on the portion of the surface 11 of the LED chip 12 using a suitable method. In a non-limiting example, a silicone slurry in which particles of the phosphor of formula I and the thermally conductive material are randomly or uniformly suspended may be formed, and a layer of the slurry may be deposited on at least a portion of the surface 11 of the LED chip 12. The illustrated embodiment is merely an example of possible positions of the composite material and the LED chip 12 in the lamp 10.

In some other embodiments, the composite material may be coated on an inner surface 17 of the casing 18 of the lamp 10, instead of being directly disposed on the LED chip 12. The composite material may be coated on the entire inner surface 17 or one or more portions of the inner surface 17 of the casing 18. By way of example, a portion of the inner surface 17 indicated by reference numeral 19 may be coated with the composite material. Such a portion 19 of the inner surface 17 may be selected such that a desirable amount of light from the LED chip 12 passes through the selected portion. Additionally, or alternatively, the composite material may be located in one or more suitable locations other than the casing 18.

Referring to FIG. 2, a lamp 30, in some embodiments, includes a composite material including a phosphor layer 24 disposed on at least a portion of the surface 11 of the LED chip 12 and a thermally conductive layer 26 including a thermally conductive material disposed on the phosphor layer 24. The phosphor layer 24 includes a phosphor of formula I as described herein dispersed at least in a portion of a first binder material. The thermally conductive layer 26 includes a thermally conductive material (as described herein) dispersed at least in a portion of a second binder material. The first binder material and the second binder material include a suitable binder material as described below. In some embodiments, the first binder material and the second binder material are same. The phosphor layer 24 and the thermally conductive layer 26 may be disposed using individual slurries, a first slurry having particles of the phosphor of formula I dispersed in the first binder material and a second slurry having the thermally conductive material dispersed in the second binder material, respectively.

Suitable materials for the first and/or second binder materials may include a material that is optically transparent to light emitted by the LED chip 12, the phosphor of formula I, an additional luminescent material (described below) or combinations thereof, and chemically and optically compatible with the phosphor of formula I, the thermally conductive material and any surrounding materials or layers in a lighting apparatus. Examples of the materials for the first and/or second binder materials for use in the lighting apparatus as described herein may include epoxies, silicones and silicones derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; a low temperature glass, or combinations thereof.

The phosphor of formula I is a complex fluoride. In one embodiments, the phosphor of formula I is a manganese ($Mn^{4+}$) doped complex fluoride. Complex fluorides have a host lattice containing one coordination center, surrounded by fluoride ions acting as ligands, and charge-compensated by counter ions (A) as required. For example, in $K_2[SiF_6]$, the coordination center is Si and the counter ion is K. Complex fluorides are generally represented as a combination of simple, binary fluorides. The square brackets in the chemical formula for the complex fluorides (occasionally omitted for simplicity) indicate that the complex ion present in that particular complex fluoride is a new chemical species, different from the simple fluoride ion. In the phosphor of formula I, the $Mn^{4+}$ dopant or activator acts as an additional coordination center, substituting a part of the coordination center, for example, Si, forming a luminescent center. The manganese doped phosphor of formula I: $A_2[(M,Mn)F_6]$ may also be represented as $A_2[MF_6]:Mn^{4+}$. The host lattice (including the counter ions) may further modify the excitation and emission properties of the activator ion. As used herein, the terms "phosphor of formula I" and "manganese doped phosphor" may be used interchangeably throughout the specification.

The counter ion A in formula I is Li, Na, K, Rb, Cs, or combinations thereof, and y is 6. In certain embodiments, A is Na, K, Rb, or combinations thereof. The coordination center M in formula I is an element selected from the group consisting of Si, Ge, Ti, Zr, Hf, Sn, Al, Ga, In, Sc, Y, Bi, La, Gd, Nb, Ta, and combinations thereof. In certain embodiments, M is Si, Ge, Ti, or combinations thereof. In some embodiments, A is K and M is Si. Examples of the phosphors of formula I include $K_2[SiF_6]:Mn^{4+}$, $K_2[TiF_6]:Mn^{4+}$, $K_2[SnF_6]:Mn^{4+}$, $Cs_2[TiF_6]:Mn^{4+}$, $Rb_2[TiF_6]:Mn^{4+}$, $Cs_2[SiF_6]:Mn^{4+}$, $Rb_2[SiF_6]:Mn^{4+}$, $Na_2[TiF_6]:Mn^{4+}$, $Na_2[ZrF_6]:Mn^{4+}$, $K_3[ZrF_7]:Mn^{4+}$, $K_3[BiF_6]:Mn^{4+}$, $K_3[YF_6]:Mn^{4+}$, $K_3[LaF_6]:Mn^{4+}$, $K_3[GdF_6]:Mn^{4+}$, $K_2[NbF_7]:Mn^{4+}$ and $K_2[TaF_7]:Mn^{4+}$. In certain embodiments, the phosphor of formula I is $K_2[SiF_6]:Mn^{4+}$.

Other manganese doped phosphors that may be used in a lighting apparatus as described herein include:
(A) $A_2[MF_5]:Mn^{4+}$, where A is selected from Li, Na, K, Rb, Cs, and combinations thereof; and where M is selected from Al, Ga, In, and combinations thereof;
(B) $A_3[MF_6]:Mn^{4+}$, where A is selected from Li, Na, K, Rb, Cs, and combinations thereof; and where M is selected from Al, Ga, In, and combinations thereof;
(C) $Zn_2[MF_7]:Mn^{4+}$, where M is selected from Al, Ga, In, and combinations thereof;
(D) $A[In_2F_7]:Mn^{4+}$ where A is selected from Li, Na, K, Rb, Cs, and combinations thereof;
(E) $E[MF_6]:Mn^{4+}$, where E is selected from Mg, Ca, Sr, Ba, Zn, and combinations thereof; and where M is selected from Ge, Si, Sn, Ti, Zr, and combinations thereof;
(F) $Ba_{0.65}Zr_{0.35}F_{2.70}:Mn^{4+}$; and
(G) $A_3[ZrF_7]:Mn^{4+}$ where A is selected from Li, Na, K, Rb, Cs, and combinations thereof.

In some embodiments, the manganese doped phosphor, for example the phosphor of formula I may be post-treated for enhancing performance and color stability properties to attain color stable manganese doped phosphors as described in U.S. Pat. No. 8,252,613. The post-treatment process includes contacting a manganese doped phosphor (for example, the phosphor of formula I) at an elevated temperature with a fluorine-containing oxidizing agent in gaseous form.

The amount of manganese in the phosphor of formula I as described herein, may range from about 1.2 mol percent (mol %) (about 0.3 weight percent (wt %)) to about 16.5 mol % (about 4 wt %). In some embodiments, the amount of manganese may range from about 2 mol % (about 0.5 wt %) to 13.4 mol % (about 3.3wt %), or from about 2 mol % to 12.2 mol % (about 3 wt %), or from about 2 mol % to 11.2 mol % (about 2.76 wt %), or or from about 2 mol % to about 10 mol % (about 2.5 wt %), or from about 2 mol % to 5.5 mol % (about 1.4 wt %), or from about 2 mol % to about 3.0 mol % (about 0.75 wt %).

The phosphor of formula I for use in the layer 22 (FIG. 1) and/or the phosphor layer 24 (FIG. 2) of the composite material may have a particle size distribution with a D50 particle size in a range from about 10 microns to about 80 microns. In some embodiments, it is desirable to use particles having smaller particle sizes, for example a D50 particle size of less than about 30 microns. In some embodiments, the phosphor of formula I has D50 particle size in a range from about 10 microns to about 20 microns. In particular embodiments, the phosphor of formula I has D50 particle size in a range from about 12 microns to about 18 microns.

The thermally conductive material for use in the lighting apparatus as described herein includes a material selected from the group consisting of indium oxide, tin oxide, indium tin oxide, calcium oxide, barium oxide, strontium oxide, aluminum hydroxide, magnesium hydroxide, calcium hydroxide, barium hydroxide, strontium hydroxide, zinc hydroxide, aluminum phosphate, magnesium phosphate, calcium phosphate, barium phosphate, strontium phosphate, diamond, graphene, polyethylene nanofibers, carbon nanotubes, silver metal nanoparticles, copper metal nanoparticles, gold metal nanoparticles, aluminum metal nanoparticles, boron nitride, silicon nitride, an alkali metal halide, calcium fluoride, magnesium fluoride, a compound of formula II, and combinations thereof;

$$A_x[MF_y] \quad (II)$$

where, A in the compound of formula II is Li, Na, K, Rb, Cs, or combinations thereof and M in the compound of formula II is an element selected from the group consisting of Si, Ge, Ti, Zr, Hf, Sn, Al, Ga, In, Sc, Y, Bi, La, Gd, Nb, Ta, and combinations thereof. In some embodiments, A is Na, K, Rb, or combinations thereof. In some embodiments, M is Si, Ge, Ti, or combinations thereof.

In some embodiments, the thermally conductive material includes a material having a thermal conductivity higher than 5 watts per meter kelvin (W/m·K). In some embodiments, the thermally conductive material is free of manganese.

The alkali metal halide may include a fluoride, chloride or bromide of Na, K, Rb, Cs, or combinations thereof. Suitable examples of the alkali metal halides include KF, $KHF_2$, KCl, KBr, NaF, NaHF$_2$, RbF, RbHF$_2$, CsF, CsHF$_2$, or combinations thereof. In some embodiments, in the compound of formula II, A includes K, Na or a combination thereof. In certain embodiments, A is K and M is Si. Suitable examples of the compounds of formula II include, but are not limited to, K$_2$SiF$_6$, K$_2$TiF$_6$, K$_2$ZrF$_6$, K$_2$SnF$_6$, K$_3$ZrF$_7$, K$_3$LnF$_6$, K$_3$YF$_6$, K$_2$NbF$_7$, K$_2$TaF$_7$, Na$_2$SiF$_6$, Na$_2$TiF$_6$, Na$_2$SnF$_6$, Na$_2$ZrF$_6$, LiKSiF$_6$, RbKLiAlF$_6$ or combinations thereof.

The phosphor of formula I, the thermally conductive material or both may be dispersed uniformly or non-uniformly in the first binder material, the second binder material or the binder material as described herein. The thermally conductive material may be present in an amount greater than 1 weight percent, based on a total amount of the composite material. In some embodiments, the thermally conductive material is present in an amount in a range from about 1 weight percent to about 50 weight percent, based on the total amount of the composite material. In some embodiments, the thermally conductive material is present in an amount in a range from about 5 weight percent to about 30 weight percent, based on the total amount of the composite material. In some embodiments, the thermally conductive material is present in an amount in a range from about 10 weight percent to about 20 weight percent, based on the total amount of the composite material.

The thermally conductive material may have a fine particle size distribution, for example submicron size or smaller. Fine particles of the thermally conductive material may avoid undesirable scattering of the light emitted by the LED chip 12, the phosphor of formula I, any additional luminescent material or combinations thereof. In some embodiments, the thermally conductive material has an average particle size of less than 1 micron. In some embodiments, the thermally conductive material has an average particle size in a range from about 0.01 micron to about 0.5 micron.

Without being bound by any theory, it is believed that the presence of a thermally conductive material as described above with the phosphor of formula I in the composite material may help in reducing or preventing degradation of the phosphor of formula I during fabrication or operation of the lighting apparatus, for example under high temperature.

In addition to the phosphor of formula I, the lighting apparatus 10 may further include one or more additional luminescent materials, for example inorganic phosphors, quantum dot (QD) materials, electroluminescent polymers, and phosphorescent dyes. Additional luminescent materials emitting radiation of, for example green, blue, yellow, red, orange, or other colors may be used to customize a resulting light such as white light with correlated color temperature (CCTs) in the range of 2500-10000K and CRIs in the range of 50-99. In certain embodiments, an additional luminescent material includes a green emitting phosphor, such as Ce$^{3+}$ doped garnet phosphor.

In embodiments where a composite material includes the phosphor of formula I and the thermally conductive material dispersed in a binder material, an additional luminescent material may be added in the composite material along with the phosphor of formula I and the thermally conductive material. For example, the phosphor of formula I may be blended with one or more additional luminescent material, for example green, blue, yellow, orange, or red emitting phosphors or QD materials in the composite material to yield white light. In some other instances, the additional luminescent material may be disposed separately in the lighting apparatus, for example in the lamp 10 as described herein such that the LED chip 12 is radiationally coupled to the additional luminescent material. The additional luminescent material may be dispersed in any binder material, as described herein, separately, and a layer may be disposed at a suitable location in the lighting apparatus. For example, when a layer 22 including the composite material is disposed on the surface 11 of the LED chip 12 as shown in FIG. 1, a layer including the additional luminescent material (not shown in FIG. 1) may be disposed on the layer 22 or between the layer 22 and the surface 11 of the LED chip 12.

In some instances, as illustrated in FIG. 2, an additional luminescent material may be added in the phosphor layer 24 along with the phosphor of formula I or in the thermally conductive layer 26 along with the thermally conductive material. In some other instances, a layer including the additional luminescent material (not shown in FIG. 2) may be disposed on the surface 11 of the LED chip 12 located between the phosphor layer 24 and the surface 11 or between the phosphor layer 24 and the thermally conductive layer 26.

Suitable additional phosphors for use in the lighting apparatus 10 may include, but are not limited to: ((Sr$_{1-z}$(Ca,Ba,Mg,Zn)$_z$)$_{1-(x+w)}$(Li,Na,K,Rb)$_w$Ce$_x$)$_3$(Al$_{1-y}$Si$_y$)O$_{4+y+3(x-w)}$F$_{1-y-3(x-w)}$, 0<x≤0.10, 0≤y≤0.5, 0≤z≤0.5, 0≤w≤x; (Ca,Ce)$_3$Sc$_2$Si$_3$O$_{12}$(CaSiG); (Sr,Ca,Ba)$_3$Al$_{1-x}$Si$_x$O$_{4+x}$F$_{1-x}$:Ce$^{3+}$(SASOF)); (Ba,Sr,Ca)$_5$(PO$_4$)$_3$(Cl,F,Br,OH):Eu$^{2+}$,Mn$^{2+}$; (Ba,Sr,Ca)BPO$_5$:Eu$^{2+}$,Mn$^{2+}$; (Sr,Ca)$_{10}$(PO$_4$)$_6$*vB$_2$O$_3$:Eu$^{2+}$ (wherein 0<v≤1); Sr$_2$Si$_3$O$_8$*2SrCl$_2$:EU$^{2+}$; (Ca,Sr,Ba)$_3$MgSi$_2$O$_8$:Eu$^{2+}$,Mn$^{2+}$; BaAl$_8$O$_{13}$:Eu$^{2+}$; 2SrO*0.84P$_2$O$_5$*0.16B$_2$O$_3$:Eu$^{2+}$; (Ba,Sr,Ca)MgAl$_{10}$O$_{17}$:Eu$^{2+}$,Mn$^{2+}$; (Ba,Sr,Ca)Al$_2$O$_4$:Eu$^{2+}$; (Y,Gd,Lu,Sc,La)BO$_3$:Ce$^{3+}$,Tb$^{3+}$; ZnS:Cu$^+$,Cl$^-$; ZnS:Cu$^+$,Al$_{3+}$; ZnS:Ag$^+$,Cl$^-$; ZnS:Ag$^+$,Al$_{3+}$; (Ba,Sr,Ca)$_2$Si$_{1-\xi}$O$_{4-2\xi}$:Eu$^{2+}$ (wherein −0.2≤ξ≤0.2); (Ba,Sr,Ca)$_2$(Mg,Zn)Si$_2$O$_7$:Eu$^{2+}$; (Sr,Ca,Ba)(Al,Ga,In)$_2$S$_4$:Eu$^{2+}$; (Y,Gd,Tb,La,Sm,Pr,Lu)$_3$(Al,Ga)$_{5-\alpha}$O$_{12-3/2\alpha}$:Ce$^{3+}$ (wherein 0≤α≤0.5); (Ca,Sr)$_8$(Mg,Zn)(SiO$_4$)$_4$Cl$_2$:Eu$^{2+}$,Mn$^{2+}$; Na$_2$Gd$_2$B$_2$O$_7$:Ce$^{3+}$,Tb$^{3+}$; (Sr,Ca,Ba,Mg,Zn)$_2$P$_2$O$_7$:Eu$^{2+}$,Mn$^{2+}$; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$,Ce$^{3+}$; SrY$_2$S$_4$:Eu$^{2+}$; CaLa$_2$S$_4$:Ce$^{3+}$; (Ba,Sr,Ca)MgP$_2$O$_7$:Eu$^{2+}$,Mn$^{2+}$; (Y,Lu)$_2$WO$_6$:Eu$^{3+}$,Mo$^{6+}$; (Ba,Sr,Ca)$_\beta$Si$_\gamma$N$_\mu$:Eu$^{2+}$ (wherein 2β+4γ=3μ); (Ba,Sr,Ca)$_2$Si$_{5-x}$Al$_x$N$_{8-x}$O$_x$:Eu$^{2+}$ (wherein 0≤x≤2); Ca$_3$(SiO$_4$)Cl$_2$:Eu$^{2+}$; (Lu,Sc,Y,Tb)$_{2-u-v}$Ce$_v$Ca$_{1+u}$Li$_w$Mg$_{2-w}$P$_w$(Se,Ge)$_{3-w}$O$_{12-u/2}$ (where 0.5≤u≤1, 0<v≤0.1, and 0≤w≤0.2); (Y,Lu,Gd)$_{2-\varphi}$Ca$_\varphi$Si$_4$N$_{6+\varphi}$C$_{1-\varphi}$:Ce$^{3+}$, (where 0.5≤φ≤0.5); (Lu,Ca,Li,Mg,Y), α-SiAlON doped with Eu$^{2+}$ and/or Ce$^{3+}$; (Ca,Sr,Ba)SiO$_2$N$_2$:Eu$^{2+}$,Ce$^{3+}$; β-SiAlON:Eu$^{2+}$, 3.5MgO*0.5MgF$_2$*GeO$_2$:Mn$^{4+}$; (Sr,Ca,Ba)AlSiN$_3$:Eu$^{2+}$; (Sr,Ca,Ba)$_3$SiO$_5$:Eu$^{2+}$; Ca$_{1-c-f}$Ce$_c$Eu$_f$Al$_{1+c}$Si$_{1-c}$N$_3$, (where 0≤c≤0.2, 0≤f≤0.2); Ca$_{1-h-r}$Ce$_h$Eu$_r$Al$_{1-h}$(Mg,Zn)$_h$SiN$_3$, (where 0≤h≤0.2, 0≤r≤0.2); Ca$_{1-2s-t}$Ce$_s$(Li,Na)$_s$Eu$_t$AlSiN$_3$, (where 0≤s≤0.2, 0≤t≤0.2, s+t>0); and Ca$_{1-\sigma-\chi-\phi}$Ce$_\sigma$(Li,Na)$_\chi$Eu$_\phi$Al$_{1+\sigma-\chi}$Si$_{1-\sigma+\chi}$N$_3$, (where 0≤σ≤0.2, 0≤χ≤0.4, 0≤φ≤0.2).

In some embodiments, the additional luminescent material includes a green light emitting quantum dot (QD) material. The green light emitting QD material may include a group II-VI compound, a group III-V compound, a group IV-IV compound, a group IV compound, a group I-III-VI$_2$ compound, or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QD materials for use as the additional luminescent material may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al, Ga, In)$_2$ (S, Se, Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS, and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the host binder material.

Examples of electroluminescent polymers may include polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly (vinylcarbazole); and polyphenylenevinylene and their derivatives. Materials suitable for use as the phosphorescent dye may include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

The ratio of each of the individual luminescent materials, for example phosphor of formula I and the additional luminescent materials may vary depending on the characteristics of the desired resulting light output. The relative proportions of the individual luminescent materials in the lighting apparatus may be adjusted such that when emissions of the individual luminescent materials are blended, and employed in a lighting apparatus, visible light of predetermined x and y values is produced on the chromaticity diagram created by the International Commission on Illumination (CIE). In certain embodiments, the lighting apparatus emits white light. In some embodiments, the resulting white light may possess an x value in a range of about 0.20 to about 0.55, and a y value in a range of about 0.20 to about 0.55. The exact identity and amount of each luminescent material in a lighting apparatus as described herein can be varied according to the needs of the end user.

Although not illustrated, the lamps 10 and 30 of FIGS. 1 and 2, may also include scattering particles, which may be embedded in the encapsulant material 20. The scattering particles may comprise, for example, alumina (Al$_2$O$_3$), titania (TiO$_2$), zirconia (ZrO$_2$), zinc oxide (ZnO) or combinations thereof. The scattering particles may be present in an amount less than or equal to about 0.2 weight percent of the total amount of the encapsulant material 20. In some embodiments, the scattering particles may be present in an amount less than or equal to about 0.1 weight percent of the total amount of the encapsulant material 20. The scattering particles may have an average particle size, for example greater than 1 micron to effectively scatter the coherent light emitted from the LED chip, the phosphor of formula I, the additional luminescent material, or combinations thereof, with a negligible amount of absorption. In some embodiments, the scattering particles have an average particle size in a range from about 1 micron to about 10 microns.

The composite materials described above may be used in additional applications besides LEDs. For example, the composite materials may be used in a fluorescent lamp, in a cathode ray tube, in a plasma display device or in a liquid crystal display (LCD). The composite materials may also be used in a scintillator in an electromagnetic calorimeter, in a gamma ray camera, in a computed tomography scanner, or in a laser. These uses are meant to be merely exemplary and not exhaustive.

Non-limiting examples of lighting apparatus include devices for excitation by light-emitting diodes (LEDs) such as fluorescent lamps, cathode ray tubes, plasma display devices, liquid crystal displays (LCD's), ultraviolet (UV) excitation devices, such as chromatic lamps, backlighting devices, liquid crystal displays (LCD), plasma screens, xenon excitation lamps, and UV excitation marking systems. The list of these devices is meant to be merely exemplary and not exhaustive. In some embodiments, a backlight device includes a lighting apparatus as described herein. The backlight device may include a surface mounted device (SMD) structure. Examples of the backlight devices include, but are not limited to, televisions, computers, monitors, smartphones, tablet computers and other handheld devices that have a display including an LED light source as described herein.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A lighting apparatus comprising:
a light emitting diode (LED) light source radiationally coupled to a composite material comprising a phosphor of formula I and a thermally conductive material dispersed in at least a portion of a binder material,

$$A_x[(M, Mn)F_y] \tag{I}$$

wherein the thermally conductive material comprises a material selected from the group consisting of aluminum phosphate, magnesium phosphate, calcium phosphate, barium phosphate, strontium phosphate, an alkali metal halide, calcium fluoride, magnesium fluoride, a compound of formula II, and combinations thereof;

(II)

wherein A is independently at each occurrence Li, Na, K, Rb, Cs, or combinations thereof, M is independently at each occurrence Si, Ge, Sn, Ti, Zr, Al, Ga, In, Sc, Hf, Y, La, Nb, Ta, Bi, Gd, or combinations thereof, x is independently at each occurrence an absolute value of a charge on a $[(M,Mn)F_y]$ ion and a $[MF_y]$ ion, and y is 5, 6, or 7.

2. The lighting apparatus according to claim 1, wherein the thermally conductive material has an average particle size of less than 1 micron.

3. The lighting apparatus according to claim 1, wherein the thermally conductive material has an average particle size in a range from about 0.01 micron to about 0.5 microns.

4. The lighting apparatus according to claim 1, wherein the thermally conductive material is present in a range from about 1 weight percent to about 50 weight percent, based on the total amount of the composite material.

5. The lighting apparatus according to claim 1, wherein the thermally conductive material is present in a range from about 10 weight percent to about 20 weight percent, based on the amount of the composite material.

6. The lighting apparatus according to claim 1, wherein the thermally conductive material is free of manganese.

7. The lighting apparatus according to claim 1, wherein the alkali metal halide comprises potassium fluoride, potassium chloride, potassium bromide, or combinations thereof.

8. The lighting apparatus according to claim 1, wherein A is K and M is Si in the formula I and the formula II.

9. The lighting apparatus according to claim 1, wherein the binder material comprises a silicone or a silicone derivative, an epoxy or a low temperature glass.

10. A backlight device comprising the lighting apparatus in accordance with claim 1.

* * * * *